United States Patent [19]

Fassino et al.

[11] Patent Number: 4,733,111
[45] Date of Patent: Mar. 22, 1988

[54] SEQUENTIAL-LOGIC BASIC ELEMENT IN CMOS TECHNOLOGY OPERATING BY A SINGLE CLOCK SIGNAL

[75] Inventors: Mario Fassino, Turin; Guido Ghisio, Ivrea, both of Italy

[73] Assignee: Cselt—Centro Studi e Laboratori Telecomunicazioni S.p.A., Turin, Italy

[21] Appl. No.: 869,171

[22] Filed: May 30, 1986

[30] Foreign Application Priority Data

Jul. 17, 1985 [IT] Italy ................... 6765 A/85

[51] Int. Cl.[4] ............... H03K 3/289; H03K 17/04; H03K 23/52; H03K 27/00
[52] U.S. Cl. .................... 307/452; 307/481; 307/576; 307/579; 307/585; 307/279; 307/272.2; 377/79; 377/117; 377/121
[58] Field of Search ............ 307/443, 451, 452, 481, 307/272 A, 279, 575, 576, 579, 583, 585; 377/66, 79, 80, 105, 117, 121

[56] References Cited

U.S. PATENT DOCUMENTS

| | | | |
|---|---|---|---|
| 3,457,435 | 7/1969 | Burns et al. | 307/585 |
| 3,651,342 | 3/1972 | Dingwall | 307/585 |
| 4,114,049 | 9/1978 | Suzuki | 377/105 |
| 4,484,087 | 11/1984 | Mazin et al. | 307/272 A |
| 4,521,695 | 6/1985 | Mazin et al. | 377/117 X |
| 4,554,467 | 11/1985 | Vaughn | 307/583 X |

FOREIGN PATENT DOCUMENTS 161535 9/1983 Japan .................. 307/452

Primary Examiner—Stanley D. Miller
Assistant Examiner—David R. Bertelson
Attorney, Agent, or Firm—Karl F. Ross; Herbert Dubno

[57] ABSTRACT

The basic element provided by the invention carries out the basic logic functions of storage and/or transfer of the data applied at the input, typical of a latch. Two ways of embodiment of the basic element having active phase at the high and low level of the clock signal are described. The basic element presents a transfer-gate transistor at the input controlled by the clock signal, followed by an inverter at whose signal leads two positive feedback networks are connected, one of which controlled by the clock signal, to stabilize the logic levels (FIG. 1).

5 Claims, 8 Drawing Figures

SEQUENTIAL-LOGIC BASIC ELEMENT IN CMOS TECHNOLOGY OPERATING BY A SINGLE CLOCK SIGNAL

FIELD OF THE INVENTION

The present invention relates to a sequential logic circuit and, more particularly, to a sequential-logic basic element in CMOS technology operating by a single clock signal.

BACKGROUND OF THE INVENTION

CMOS technology has been long neglected owing to high production cost, which only lately have been reduced thanks to improvements both in fabricating processes and in circuit schemes.

In the field of implementation of VLSI integrated circuit, CMOS technology presents a number of advantages.

When compared to implementations of equivalent complexity in NMOS technology, CMOS circuits are characterized by a very low dissipation limited only at switching instants, while under static conditions their dissipation is practically nill.

The instrinsically good noise-immunity makes CMOS cicuits suitable for use on board satellites and in telecommunication circuits in general, where reliability and noise immunity problems are more stringent.

They are also suitable for use in analog circuits: that allows the development of circuit systems comprising both analog and digital elements on the same chip.

In MOS-technology circuits generally in use, the timing control of the sequential-logic elements is effected by means of so called "transfer-gate" transistors, which interrupt or allow the signal flow on the line in a mode similar to the switching on/off of a switch. Such transistors are driven by two clock signals forming a two-phase timing. The two clock signals can simply have two opposite logic levels or provide also additional periods in which both present a non-active logic level, to assure greater stability in the signal logic levels.

The latter are referred to as "non overlapping phases" which, for implementation, need rather complex circuit structures which occupy significant portions of the integrated circuit area, and require great care to balance the load distributions on each of them so as not to alter phase relations of the produced signals.

In any case a two-phase timing requires the presence of two conduction paths inside the integrated circuit, with a consequent increase in circuit complexity.

A sequential logic basic-element in CMOS technology using a single clock signal is known and described in the article: "Efficient custom digital IC design for control applications" Proceedings of the 4th International Conference on Custom and Semi-custom ICs; 6–8 November 1984, London.

This known structure uses two PMOS and two NMOS transfer-gate transistors as well as a conventional CMOS inverter, the latter consisting of two enhancement MOS transistors, the one P-channel the other N-channel, arranged in series.

Even though this structure is implemented in CMOS technology, its operation is of "quasi-NMOS" type, i.e. the circuit is dissipative even under static conditions.

In addition the following critical condition occurs: when the input data and the clock signal, respectively applied to the channel and to the gate of the first NMOS transfer-gate transistor, are at logic level "1", the transistor transfers inside the structure a logic level affected by a considerable voltage drop due to the transistor threshold voltage and to "body effect" so as to make the datum assume an uncertain logic condition.

OBJECTS OF THE INVENTION

It is the principal object of the present invention to solve these problems with a sequential logic basic-element in CMOS technology operating by a single clock signal, allowing a considerable simplification of the structure in addition to a reduction in the area occupied by conduction paths in the integrated circuit.

Another object is to provide a CMOS it presents a CMOS operation integrated circuit which is characterized by a limited dissipation confined to the only switching instants, it consists of a limited number of transistors thus allowing a further limited integrated circuit area occupation, possessing good noise immunity and wherein the internal and output logic states are within the permitted error margin.

SUMMARY OF THE INVENTION

According to the Invention, a sequential-logic basic element in CMOS technology which carries out basic functions of data transfer and/or storage operated by a single clock signal whose active level controls the data transfer function, and whose nonactive level controls the data storage function, comprises:

a logic inverter whose output is that of the basic element;

a first transistor which transfers a datum applied to its input, which is also the input of the basic element, to the input of the logic inverter when the clock signal applied to its control input has active level, otherwise it decouples the input of the basic element from that of the inverter;

a second transistor forming a first positive feedback network between output and input of the logic inverter, the feedback intervening when at the inverter input a logic level exists which would be affected by an error caused by the threshold voltage of the first transistor; and a second positive feedback network between output and input of the logic inverter controlled by the clock signal which, when nonactive, enables the feedback of the second network which intervenes only when at the logic-inverter input a logic level exists unaffected by the error due to the threshold voltage of the first transistor.

Advantageously, the logic element has an active phase at the high voltage level of the clock signal, and the first transistor is of the NMOS type and to its gate the clock signal is applied;

the second transistor is of the PMOS type and has the gate and drain connected respectively to the output and the input of the logic inverter and the source connected to a high-level supply voltage;

the second positive feedback network comprises a third transistor of NMOS type whose gate and drain are connected respectively to the output and input of the logic inverter;

a fourth transistor of PMOS type which has the source connected to the source of the third transistor, the drain to a low-level supply voltage, and the gate the the clock signal; and the first to fourth transistors are of the enhancement type.

The latter element carries out the supplementary functions of asynchronous set and reset and comprises:

a first NAND gate to replace the logic inverter whose function it carries out, an input and the output of the first NAND gate replacing the input and output of the logic inverter; to a second input of the first NAND gate a control signal of the asynchronous set function being sent, the control signal being of the low-active type;

a fifth transistor of PMOS type, whose channel is connected in parallel with that of the second transistor;

a sixth transistor of the NMOS type, whose channel is placed in series in the second positive feedback network; the fifth and sixth transistors being of the enhancement type and receiving at the gate a control signal of the asynchronous reset function, of the low-active type.

Alternatively, the logic element has an active phase at the low voltage level of the clock signal and in which:

the first transistor is of the PMOS type, to whose gate the clock signal is applied;

the second transistor is of NMOS type, and has the gate and drain connected respectively to the output and input of the logic inverter, and the source of the low level supply;

the second positive feedback network comprises: a third transistor of the NMOS type having the source connected to the output of the inverter, and the gate to the clock signal; a fourth transistor of the PMOS-type which has the source connected to the high-level supply and the gate to the clock signal; a fifth transistor of the PMOS type which has the source connected to the high level supply, and the drain to the input of the logic inverter; the gate of the fifth, the drain of the fourth and the drain of the third transistor being interconnected; the first to fifth transistors being of the enhancement type.

The latter element carries out supplementary functions of asynchronous set and reset and can also comprise:

a second NAND gate ND4 to replace the logic inverter whose function it carries out; an input and the output of the second NAND gate replacing the input and output of the logic inverter; to a second input of the second NAND data a control signal of the asynchronous set function being sent, the control signal being of the low active type;

a seventh transistor of the NMOS type, whose channel is placed in series with that of the second transistor, an eighth transistor of the PMOS type, whose channel is arranged in parallel with that of the fifth transistor; the seventh and eighth transistors being of enhancement type and receiving at the gate a control signal of the asynchronous reset function, of the low-active type.

The logic element can constitute part of a D-type master-slave flip-flop which comprises a first of the basic elements having active phase at the high voltage level of the clock signal in master position, followed by a second of the basic elements having active phase at the low voltage level of the clock signal in slave position; the input of the first basic element being the data input of the first basic element being the data input of the network, the output of the second basic circuit being the network data output; the output the first basic element being connected to the input of the second, the clock signal being sent to the first and second basic elements.

The circuit can include a third of the basic elements having active phase at the low-voltage level of the clock signal in master position, followed by a fourth of the basic elements having active phase at the high voltage level of the clock signal in slave position; the input of the third basic element being the data input of the network, the output of the fourth basic element being the network data output; the output of the third basic element being connected to the input of the fourth, the clock signal being sent to the third and fourth basic elements.

BRIEF DESCRIPTION OF THE DRAWING

The invention will be now described with reference to two embodiments threof and to their variants and combinations given by way of examples and not in a limiting sense and to the circuit diagrams of the annexed drawing in which.

SPECIFIC DESCRIPTION

Hereinafter the described sequential-logic basic elements will be referred to by the term "latch" which is usual in the art.

Latches described here carry out the known basic operations of data transfer and/or storage, respectively controlled by the active and non-active level of a clock signal.

Besides it has to be taken into account that hereinafter channel terminals "drain" and "source" of MOS transistors forming the latch will be uniequivocally identified only for the sake of clarity; actually these terminals can be physically taken as interchangeable, as the channel of said MOS transistors is simmetrical, and hence it is not necessary to functionally identify its terminations.

Figure 1:
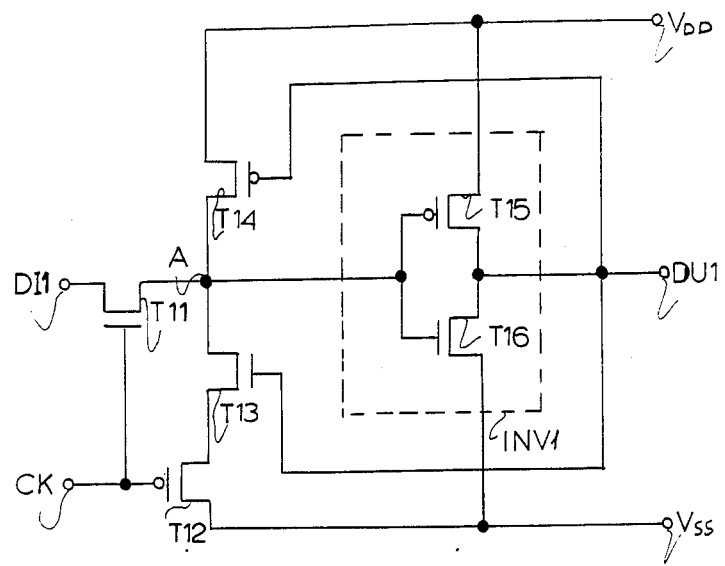
FIG. 1 shows a first embodiment of the basic circuit provided by the invention, having active phase at high logic level of the clock signal.

FIG. 1 the N-type latch, with active phase at the high voltage level of clock signal CK, is composed of NMOS transistors T11, T13, T16, and of PMOS transistors T12, T14, T15, all of the enhancement type.

T11 carries out the transfer-gate function for the data applied to input DI1 connected to the drain.

The only clock signal CK present is applied to the gate of T11 and T12.

The high-level supply voltage $V_{DD}$ is applied to the sources of T14, T15, while low-level supply voltage $V_{SS}$ is applied to the sources of T12 and T16.

The drain of T14, T11, the drain of T13, and the gates of T15, T16 are connected together in node A.

The drain of T15 and the drain of T16 are connected together and form the data output DU1 of the latch, which is also fed back to the gates of T13 and T14.

The drain of T12 is connected to the source of T13.

Transistors of T15 and T16 form logic inverter INV1 of known type, in which the data input is node A and the data output is the output DU1 of the latch.

The operation of the circuit of FIG. 1 is now described, by the analysis of the logic levels at the internal nodes determined by the logic levels at the inputs.

The logic level "1" of clock signal CK cuts off transistor T12 and activates T11 which forces the voltage of node A to the logic level of input DI1.

If DI1 is at logic "0", the output DU1 goes to "1", T14 is cut off and T13 can conduct, but the conduction is prevented by the state of T12.

If, however, DI1 is at "1", the voltage of node A is that of the input DI1 reduced by the voltage drop dependent on the threshold voltage of T11 and on the "body" effect; such a voltage of node A is such as to cause at output DU1 a voltage capable of activating T14 conduction thus giving rise to a positive feedback which strengthens and stabilizes the logic levels both on node A (logic "1") and at the output of DU1 (logic "0").

Hence, with CK at "1", the latch simply transfers the input data, with the logic level inverted, to the output.

The logic level "0" of clock signal CK cuts off T11 and activates T12. If output DU1 is at "0", T14 is active and keeps node A at "1". T13 cuts off decoupling signal CK and the signal at node A.

If, however, DU1 is at "1", T14 is cut off, while T13 is active, allowing the correct logic condition (logic "0") to be maintained on node A which is connected to supply voltage $V_{SS}$.

With CK at "0", the latch keeps the datum, previously transferred into node A, stored.

The latch of FIG. 1 comprises two positive feedback networks: the first consists of transistor T14 which is to stabilize logic level "1" when present on node A, i.e. the level which, without feedback, would be affected by the voltage drop caused by T11 threshold voltage; the second consists of transistors T13, T12, and is controlled by synchronism signal CK which, when active (operation of the latch in data transfer), interrupts the feedback produced by T13, while when non-active (operation of the latch in data storage) enables it.

Figure 2:
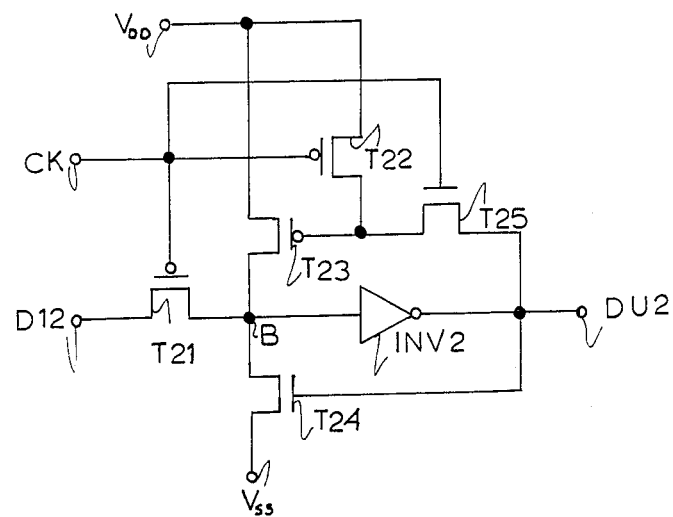
FIG. 2 shows a second embodiment of the basic circuit, having active phase at low logic level of the clock signal.

In FIG. 2 the P-type latch with active phase at the low voltage level of clock signal CK is composed of PMOS transistors T21, T22, T23, of NMOS transistors T24, T25 all of the enhancement type, and of logic inverter INV2, equivalent to INV1 of FIG. 1, and here indicated only by the circuit symbol in which, to symplify the drawing, the connections with supply voltages $V_{DD}$, $V_{SS}$ have not been shown.

T21 carries out the transfer-gate function for input data DI2 applied to the drain. Clock signal CK is applied to the gates of T21, T22, T25.

The high-level supply voltage $V_{DD}$ is applied to the sources of T22, T23, while the low-level supply voltage $V_{SS}$ is applied to the source of T24.

The drain of T21, T23, the drain of T24 and the input of the inverter INV2, are connected together in node B.

The gate of T23 and the drain of T22, T25 are connected together, while the output of INV2, which is also the data output DU2 of the latch, is fed back to the gate of T24 and to the source of T25.

The operation of the circuit of FIG. 2 will be now described.

The logic level "0" of the clock signal CK cuts off transistor T25 and activates T21, T22; the latter cuts off T23 raising the gate voltage to $V_{DD}$. In this way the logic level of node B will be forced to the level of input signal DI2.

If DI2 is at "0", the voltage of node B, wil be that of DI2 reduced by the voltage drop dependent on the negative threshold voltage of T21 and on the "body" effect.

Said voltage on node B is such as to cause at the output DU2 a voltage capable of activating T24, by introducing a positive feedback which is to strengthen and stabilize the logic levels both on node B (logic "0") and at the output DU2 (logic "1").

If however DI2 is at "1", the voltage of node B will be the same as that of DI2, such as to cause the output DU2, through INV2, to go to logic level "0" which cuts off T24.

With CK at "0", the latch of FIG. 2 simply transfers the input data to the output with the logic level inverted.

The logic level "1" of CK cuts off T21 and T22, and activates T25. If the signal of output DU2 is at "0", T23, which keeps node B at voltage $V_{DD}$ (logic "1") is activated through T25.

Transistor T24 is cut off, decoupling the voltage of node B and supply voltage $V_{SS}$.

If, however, the signal of output DU2 is at "1", T23 is cut off, while T24 is activated which causes the voltage on node B to go to value $V_{SS}$, i.e. logic "0".

With CK at "1", the latch of FIG. 2 keeps the data, previously introduced, stored.

Also the latch of FIG. 2 comprises two positive feedback networks: the first is transistor T24 which is to stabilize the logic level "0" when present on node B, i.e. the level which without feedback, would be affected by the voltage drop caused by the threshold voltage of T21; the second consists of transistors T22, T23, T25 and is controlled by clock signal CK which, when active (operation of the latch in data transfer) interrupts the feedback produced by said network, while, when non-active (operation of the latch in data storage) enables it.

Figure 3:
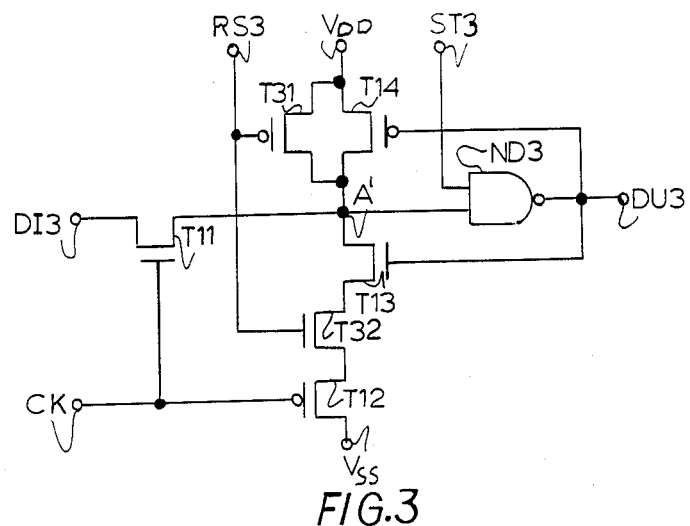
FIGS. 3 and 4 show the modifications to be given to the circuits of FIGS. 1 and 2 respectively to introduce the functions of asynchronous set and reset.

FIG. 3 emphasizes the circuit modifications to be made to the N-type latch of FIG. 1 to introduce asynchronous set and reset functions.

In FIG. 3 T11, . . . , T14 denote the same transistors of FIG. 1 for which the description made in relation to FIG. 1 is still valid as to both their interconnection and the operation relevant to the basic functions of data transfer and storage.

ND3 denotes a NAND gate which, besides carrying out the function of inverter INV1 of FIG. 1, carries out also that of asynchronous set. ND3 has an input connected to node A' (equivalent to node A of FIG. 1) and the second input ST3 at the asynchronous set signal active at logic level "0". The output of ND3 is the data output DU3.

If ST3 is at "0", the output of ND3 is forced at "1" (logic level desired for the asynchronous set function); if on the contrary ST3 is at "1", its presence does not affect the behaviour of the rest of the circuit and hence the state of output DU3 is determined by that of node A.

The asynchronous reset function is obtained by the insertion of PMOS enhancement transistor T31 and NMOS enhancement transistor T32.

The gates of T31 and T32 are connected to input RS3 to which the asynchronous reset signal is sent, active at logic level "0"; the channel of T31 is connected in parallel whit that of T14, while the channel of T32 in series with those of T13, T12.

If RS3 is at "0", T32 is cut off, interrupting the conduction of the relative network, while T31 is active, connecting $V_{DD}$ to node A': in this way the output DU3 will go to logic level "0" which is the one desired for the reset function.

If RS3 is at "1", T31 is cut off while T32 conducts: hence their presence does not affect the behaviour of the rest of the circuit.

Figure 4:
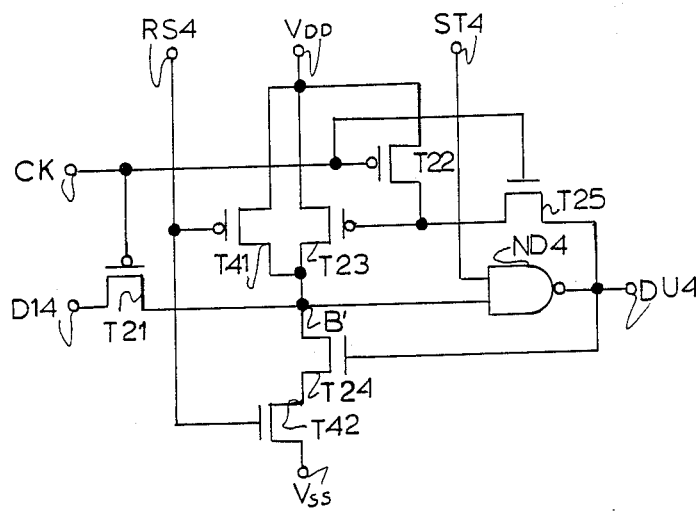

FIG. 4 emphasizes circuit modifications to be made to the P-type latch of FIG. 2 to introduce the asynchronous set and reset functions.

In FIG. 4, T21, ..., T25 denote the same transistors as those of FIG. 2 for which the description made in connection with FIG. 2 still holds as for both their interconnection and the operation relative to the basic functions of data transfer and storage.

ND4 denotes a NAND gate, which, besides carrying out the function of inverter INV2 of FIG. 2, carries out also that of asynchronous set.

ND4 has an input connected to node B' (equivalent to node B of FIG. 2) and another input ST4 to the asynchronous set signal, active at logic level "0". The output of ND4 is data output DU4. The function and the operation of ND4 are quite equivalent to those of ND3 of FIG. 3.

The asynchronous reset function is obtained by the insertion of transistor T41 of the enhancement PMOS type and T42 of the enhancement NMOS type.

The gates of T41 and T42 are connected to the input RS4 to which the asynchronous reset signal is carried, active at logic level "0"; T41 channel is connected in parallel with that of T23, while T42 channel is placed in series with that of T24 and supply voltage $V_{SS}$.

If RS4 is at "0", T42 is cut off, interrupting the conduction in the relevant network, while T41 is active, connecting $V_{DD}$ to node B': in this way the output DU4 will go to logic level "0" which is the one desired for the reset function.

If RS4 is at "1", T41 is cut off while T42 conducts: hence their presence does not affect the behaviour of the rest of the circuit.

By duly interconnecting the circuits of FIGS. 1 and 2, or 3 and 4, sequential circuits implementing fundamental logic functions can be obtained.

Figure 5:
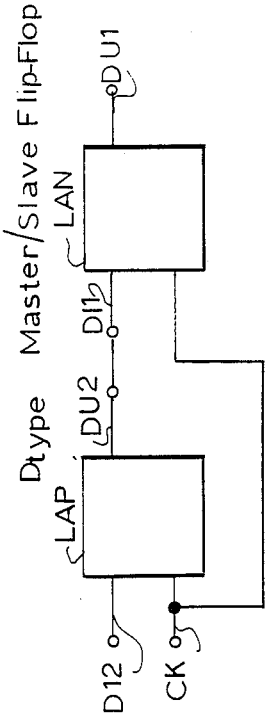
FIGS. 5 and 6 show examples of sequential logic networks obtained by combining the circuits of FIGS. 1 and 2.

E.g. FIG. 5 shows a sequential circuit implementing D-type master-slave flip-flip function, which operates with the only check signal CK.

LAN denotes the N-type latch of FIG. 1, while LAP denotes the P-type latch of FIG. 2: the input of the flip-flop is the input DI1 of LAN; the output is DU2 of LAP; the output DU1 of LAN is connected with the input DI2 of LAP; the clock inputs are connected together.

The data input in LAN, which carries out the master function, takes place at the high logic level of CK, while the data output from LAP, which acts as a slave takes place at the low logic level of CK.

Figure 6:
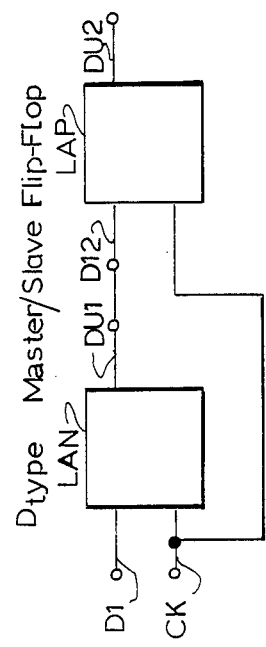

By inverting the order of the two latches LAN, LAP of FIG. 5 another D-type master-slave flip-flop is obtained which operates with the single clock signal CK, emphasized in FIG. 6.

In the case of FIG. 6, the data input is input DI2 of LAP, the data output is the output DU1 of LAN: now LAP carries out the master function and the data input takes place when the logic level of CK is low, while LAN acts as a slave and the data output takes place when the logic level of CK is high.

Figure 7:
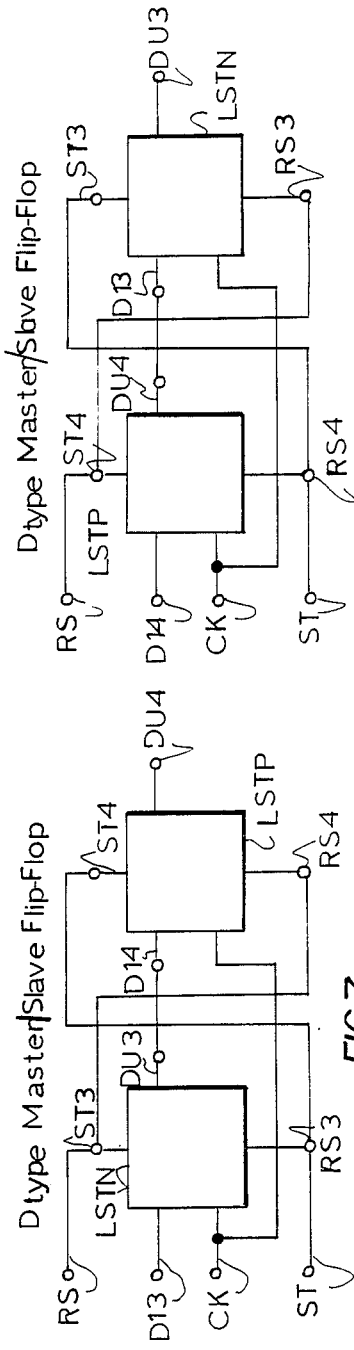
FIGS. 7 and 8 show examples of sequential logic networks obtained by combining the circuits of FIGS. 3 and 4.

FIG. 7 shows an example of D-type master-slave flip-flop with the additional asynchronous set and reset functions, operating with the single clock signal CK.

LSTN denotes the N-type latch of FIG. 3, while LSTP denotes the P-type latch of FIG. 4; as to data input and output, what mentioned in connection with the example of FIG. 5 is still valid. The additional asynchronous set function is obtained by connecting together the inputs RS3 of LSTN and ST4 of LSTP whereto asynchronous set signal ST is applied.

The additional asynchronous reset function is obtained by interconnecting the inputs ST3 of LSTN and RS4 of LSTP, whereto the asynchronous reset signal RS is applied.

Figure 8:
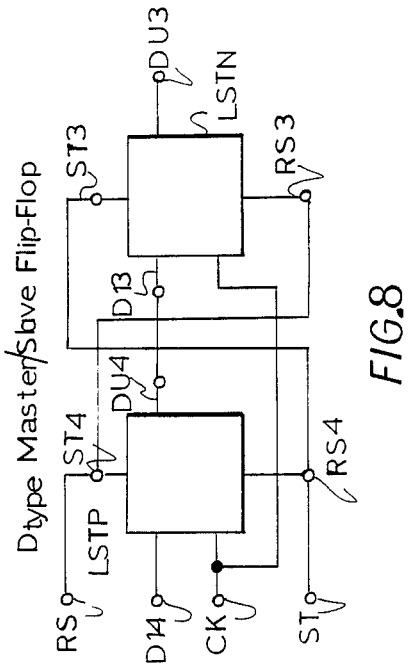

By inverting the order of the two latches LSTN, LSTP of FIG. 7, another D-type master-slave flip-flop is obtained with the additional asynchronous set and reset functions, operating with the only clock signal CK, emphasized in FIG. 8: as to the data input and output, what mentioned in connection with the example of FIG. 6 is still valid.

The supplementary asynchronous set function is obtained by interconnecting the inputs RS4 of LSTP and ST3 of LSTN whereto asynchronous set signal ST is applied; the asynchronous reset function is obtained by connecting together the inputs ST4 of LSTP and RS3 of LSTN whereto asynchronous reset signal RS is applied.

It is clear that what described has been given only by way of non limiting examples. Variations and modifications are possible without going out of the scope of the invention.

What is claimed is:

1. A CMOS sequential-logic element comprising:
   a logic inverter having an input and an output, the output signal of said element appearing at said output of said logic inverter;
   a first MOS transistor having a gate and principal electrodes connected in series between a data-input terminal for said element and said input for connecting said input with said data-input terminal upon application of a clock signal to said gate and for disconnecting said input from said data-input terminal in the absence of a clock signal applied to said gate;
   a second MOS transistor having a gate connected to said output of said logic inverter and principal electrodes in circuit with said input and forming a first positive feedback network between said output and said input of said logic inverter effective upon development of a logic level at said input of said logic inverter which would be affected by an error caused by a threshold voltage of said first transistor;
   a second positive feedback network between said output and said input of said logic inverter for rendering said second positive feedback network effective in the absence of a clock signal and enabling said second positive feedback network to intervene only when at said input of said logic inverter a logic level exists which is unaffected by said error; and
   means for applying the same clock signal simultaneously to said gate of said first transistor and to said second positive feedback network, and one of said first and second transistors being of the PMOS conduction type while the other of said first and second transistors is of the NMOS conduction type, and wherein:
   said element has an active phase at a low-voltage level of said clock signal;

said first transistor is of the PMOS type;

said second transistor is of NMOS type and has a gate and a drain connected respectively to the output and input of said logic inverter, and a source connected to a low-level supply; and said second positive feedback network comprises:

a third transistor of NMOS type having a source connected to the output of the inverter and a gate supplied with said clock signal simultaneously with the energization of the gate of said first transistor, a fourth transistor of PMOS type having a source connected to a high-level supply and a gate supplied with said clock signal, a fifth transistor of PMOS type having a source connected to said high-level supply and a drain connected to the input of the logic inverter, and means interconnecting the gate of the fifth transistor, the drain of the fourth transistor and the drain of the third transistor, said first to fifth transistors being all of the enhancement type.

2. A CMOS sequential logic element as defined in claim 1, wherein:

said logic inverter is formed by a NAND gate having a first input constituted as said input to said logic inverter;

means is provided for applying a low-active control signal of an asynchronous set function to a second input of said NAND gate;

said element further comprises a sixth transistor of NMOS type having principal electrodes in series with the principal electrodes of said second transistor; and a seventh transistor of PMOS type having principal electrodes in parallel with the principal electrodes of said fifth transistor, said sixth and seventh transistors being of the enhancement type and receiving at the gates thereof in common a low-active control signal for an asynchronous reset function.

3. A D-type master-slave flip-flop comprising sequential logic elements as defined in claim 1 which comprises a first of said elements having an active phase only at the high level of said clock signal and provided in master position, and a second of said elements having an active phase at a low level of the clock signal connected in slave position, the data input terminal of said first element being constituted by as the input to said flip-flop, said output of said first element being connected to the data input terminal of the second element, and said clock signal being sent to said first and second elements.

4. The D-type master-slave flip-flop defined in claim 3 further comprising a third of said elements having an active phase at the low level of said clock signal in master position, followed by a fourth of said elements having an active phase at the high level of the clock signal in the slave position, the input of said first element being formed on the data input of said flip-flop, the output of said fourth element being the data output of said flip-flop, the output of said third element being connected to the input of said fourth element, and said clock signal being sent to said third and fourth elements.

5. The D-type flip-flop defined in claim 3, further comprising a third of said elements having an active phase at a high level of the clock signal in master position followed by a fourth of said elements having an active phase at a low voltage level of the clock signal in slave position, the input of said first element forming the data terminal for the flip-flop, the output of said fourth element constituting a data output of said flip-flop, the output of said third element being connected to the input of said fourth element, said clock signal being sent to the third and fourth elements, the gates of said third and fourth transistors being connected to the second input of said NAND gate to receive said control signal and the asynchronous set function, further transistors being provided to receive a control signal of the asynchronous reset function and being applied to a second input of a further NAND gate.

* * * * *